United States Patent
Ping et al.

(10) Patent No.: US 7,238,613 B2
(45) Date of Patent: *Jul. 3, 2007

(54) DIFFUSION-ENHANCED CRYSTALLIZATION OF AMORPHOUS MATERIALS TO IMPROVE SURFACE ROUGHNESS

(75) Inventors: Er-Xuan Ping, Boise, ID (US); Randhir Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/158,746

(22) Filed: Jun. 22, 2005

(65) Prior Publication Data

US 2005/0239263 A1 Oct. 27, 2005

Related U.S. Application Data

(60) Continuation of application No. 10/319,938, filed on Dec. 16, 2002, now Pat. No. 6,930,015, which is a division of application No. 09/138,879, filed on Aug. 24, 1998, now Pat. No. 6,511,892, which is a division of application No. 08/807,443, filed on Feb. 28, 1997, now Pat. No. 5,937,314.

(51) Int. Cl.
*H01L 21/477* (2006.01)
*B05D 5/12* (2006.01)

(52) U.S. Cl. .................. 438/660; 427/397.7; 427/97.6

(58) Field of Classification Search ............... 438/398, 438/396, 166, 486, 253, 255, 488, 652, 658, 438/660, 665, 964; 427/397.7, 97.6; 257/309, 257/E21.012
See application file for complete search history.

(56) References Cited

U.S. PATENT DOCUMENTS

| 4,904,611 | A | 2/1990 | Chiang et al. |
| 5,130,885 | A | 7/1992 | Fazan et al. |
| 5,134,086 | A | 7/1992 | Ahn |
| 5,149,676 | A | 9/1992 | Kim et al. |

(Continued)

FOREIGN PATENT DOCUMENTS

GB  2313231 A  11/1997

(Continued)

OTHER PUBLICATIONS

Jun et al., "The Fabrication and Electrical Properties of Modulated Stacked Capacitor for Advanced DRAM Applications," *IEEE-Electron Device Letters*, 1992;13(8):430-432.

(Continued)

*Primary Examiner*—M. Wilczewski
(74) *Attorney, Agent, or Firm*—Mueting, Raasch & Gebhardt, P.A.

(57) ABSTRACT

Methods of forming a roughened surface through diffusion-enhanced crystallization of an amorphous material are disclosed. In one aspect, conductive hemispherical grain silicon can be formed through dopant diffusion-enhanced crystallization of one or more layers of amorphous silicon. To further enhance uniformity in the formation of the hemispherical grain silicon, the exposed surface of the amorphous silicon can be seeded before crystallization to further enhance uniformity of the surface structures formed in the hemispherical grain silicon.

13 Claims, 5 Drawing Sheets

U.S. PATENT DOCUMENTS

| | | | |
|---|---|---|---|
| 5,162,248 | A | 11/1992 | Dennison et al. |
| 5,202,278 | A | 4/1993 | Mathews et al. |
| 5,208,479 | A | 5/1993 | Mathews et al. |
| 5,242,507 | A | 9/1993 | Iverson |
| 5,242,855 | A | 9/1993 | Oguro |
| 5,266,514 | A | 11/1993 | Tuan et al. |
| 5,278,091 | A | 1/1994 | Fazan et al. |
| 5,290,729 | A | 3/1994 | Hayashide et al. |
| 5,318,920 | A | 6/1994 | Hayashide |
| 5,324,679 | A | 6/1994 | Kim et al. |
| 5,340,763 | A | 8/1994 | Dennison |
| 5,340,765 | A | 8/1994 | Dennison et al. |
| 5,342,800 | A | 8/1994 | Jun |
| 5,350,707 | A | 9/1994 | Ko et al. |
| 5,366,917 | A | 11/1994 | Watanabe et al. |
| 5,385,863 | A | 1/1995 | Tatsumi et al. |
| 5,407,534 | A | 4/1995 | Thakur |
| 5,418,180 | A * | 5/1995 | Brown ............... 438/398 |
| 5,444,013 | A | 8/1995 | Akram et al. |
| 5,550,070 | A | 8/1996 | Funai et al. |
| 5,573,968 | A | 11/1996 | Park |
| 5,583,070 | A | 12/1996 | Liao et al. |
| 5,597,756 | A | 1/1997 | Fazan et al. |
| 5,608,247 | A | 3/1997 | Brown |
| 5,612,558 | A | 3/1997 | Harshfield |
| 5,619,057 | A | 4/1997 | Komatsu |
| 5,629,223 | A | 5/1997 | Thakur |
| 5,634,974 | A | 6/1997 | Weimer et al. |
| 5,639,685 | A | 6/1997 | Zahurak et al. |
| 5,639,689 | A | 6/1997 | Woo |
| 5,656,531 | A | 8/1997 | Thakur et al. |
| 5,658,381 | A * | 8/1997 | Thakur et al. ............ 257/309 |
| 5,700,710 | A | 12/1997 | Zenke |
| 5,714,415 | A | 2/1998 | Oguro |
| 5,721,171 | A | 2/1998 | Ping et al. |
| 5,770,500 | A | 6/1998 | Batra et al. |
| 5,837,580 | A | 11/1998 | Thakur et al. |
| 5,856,007 | A | 1/1999 | Sharan et al. |
| 5,858,852 | A | 1/1999 | Aiso |
| 5,882,979 | A | 3/1999 | Ping et al. |
| 5,888,295 | A | 3/1999 | Sandhu et al. |
| 5,913,119 | A | 6/1999 | Lin et al. |
| 5,937,314 | A * | 8/1999 | Ping et al. ............ 438/486 |
| 6,037,219 | A | 3/2000 | Lin et al. |
| 6,046,083 | A | 4/2000 | Lin et al. |
| 6,069,053 | A | 5/2000 | Ping et al. |
| 6,077,573 | A * | 6/2000 | Kim et al. ............ 427/578 |
| 6,153,466 | A | 11/2000 | Yew et al. |
| 6,255,159 | B1 | 7/2001 | Thakur |
| 6,291,850 | B1 * | 9/2001 | Choi et al. ............ 257/309 |
| 6,350,648 | B1 | 2/2002 | Ping et al. |
| 6,385,020 | B1 * | 5/2002 | Shin et al. ............ 361/15 |
| 6,458,652 | B1 * | 10/2002 | Chen et al. ............ 438/253 |
| 6,509,227 | B1 | 1/2003 | Ping et al. |
| 6,511,892 | B1 * | 1/2003 | Ping et al. ............ 438/398 |
| 6,573,552 | B1 | 6/2003 | Thakur |
| 6,693,007 | B2 * | 2/2004 | Chen et al. ............ 438/253 |
| 6,723,613 | B2 * | 4/2004 | Huang ............ 438/398 |
| 6,756,265 | B2 * | 6/2004 | Chen et al. ............ 438/253 |
| 6,930,015 | B2 * | 8/2005 | Ping et al. ............ 438/398 |
| 6,949,427 | B2 * | 9/2005 | Chen et al. ............ 438/253 |
| 7,023,039 | B2 * | 4/2006 | Chen et al. ............ 257/298 |
| 2001/0031554 | A1 * | 10/2001 | Yamamoto ............ 438/684 |
| 2003/0129807 | A1 * | 7/2003 | Ping et al. ............ 438/398 |
| 2004/0183073 | A1 * | 9/2004 | Gu ............ 257/66 |
| 2005/0239263 | A1 * | 10/2005 | Ping et al. ............ 438/398 |

FOREIGN PATENT DOCUMENTS

| | | |
|---|---|---|
| JP | 4280669 | 10/1992 |
| JP | 5315543 | 11/1993 |
| JP | 09298284 A | 11/1997 |
| KR | 2002017788 A * | 8/2000 |

OTHER PUBLICATIONS

Mine et al., "Capacitance-Enhanced Stacked-Capacitor with Engraved Storage Electrode for Deep Submicron DRAMS," Extended Abstracts of the 21$^{st}$ Conference on Solid State Devices and Materials, Tokyo, Japan, 1989: 137-140.

H. Pierson, "Chemical Vapor Deposition," *Handbook of Chemical Vapor Deposition (CVD)*, 1992, Noyes Publications, Park Ridge, NJ:184.

Sakai et al., "Crystallization of Amorphous Silicon with Clean Surfaces," *Japanese Journal of Applied Physics*, Jun. 1991;30(6A):L941-L943.

Shinriki et al., "Leakage Current Reduction and Reliability Improvement of Effective 3nm-Thick CVD $Ta_2O_5$ Film by Two-Step Annealing," 1989 Symposium on VLSI Technology, Digest of Technical Papers, Kyoto, 25-26 (May 22-25, 1989).

Watanabe et al., "Hemispherical Grain Silicon for High Density DRAMS," *Solid State Technology*, Jul. 1992:29-33.

Watanabe et al., "Hemispherical Grained Si Formation on in-situ Phosphorus Doped Amorphous-Si Electrode for 256Mb DRAM's Capacitor," *IEEE Transactions on Electron Devices*, Jul. 1995,42(7): 1247-1253.

Watanabe et al., "A New Cylindrical Capacitor Using Hemispherical Grained Si (HSG-Si) for 256 Mb DRAMs," *IEEE IEDM*, 1992;259-262.

Watanabe,"Device application and structure observation for hemispherical-grained Si,"*J Appl. Phys.*, Apr. 1, 1992;71(7):3538-3543.

Watanabe et al., "Hemispherical Grained Silicon (HSG-Si) Formation on In-situ Phosphorous Doped Amorphous-Si Using the Seeding Method," *Extended Abstracts of the 1992 International Conference on Solid State Devices and Materials*, 1992: 422-424.

Watanabe et al., "A New Cylindrical Capacitor Using Hemispherical Grained SI (HSG-Si) for 256 Mb DRAMs," *IEEE*: 10.1.1-10.1.4.

Uemoto et al., "A High-Performance Stacked-CMOS SRAM Cell by Solid Phase Growth Technique," 1990 Symposium on VLSI Technology, *IEEE*, 1990:21-22.

* cited by examiner

DIFFUSION-ENHANCED CRYSTALLIZATION OF AMORPHOUS MATERIALS TO IMPROVE SURFACE ROUGHNESS

This is a continuation of application Ser. No. 10/319,938, filed Dec. 16, 2002, now U.S. Pat. No. 6,930,015, which is a division of application Ser. No. 09/138,879, filed Aug. 24, 1998 (U.S. Pat. No. 6,511,892), which is a division of application Ser. No. 08/807,443, filed Feb. 28, 1997 (U.S. Pat. No. 5,937,314), which are all incorporated herein by reference in their entireties.

FIELD OF THE INVENTION

The present invention relates to the field of semiconductor manufacturing. More particularly, the present invention provides methods of obtaining diffusion-enhanced crystallization of amorphous materials to improve surface roughness of the resulting crystallized material.

BACKGROUND OF THE INVENTION

Hemispherical grain silicon (commonly referred to as HSG silicon) is one example of a crystallized material with a roughened surface, i.e. a surface that is not smooth. Electrically conductive roughened surfaces are useful in the manufacturing of dynamic semiconductor storage devices requiring storage node capacitor cell plates large enough to maintain adequate charge, i.e., capacitance, in the face of parasitic capacitances and noise that may be present during operation of a circuit including the storage devices. Maintaining storage node capacitance is especially important due to the continuing increases in Dynamic Random Access Memory (DRAM) array density.

Such DRAM devices, among others, rely on capacitance stored between two conductors separated by a layer of dielectric material. One method of increasing the capacitance of a capacitor formed using conductive polysilicon layers is to increase the surface area of the conductors. Using hemispherical grain (HSG) silicon for the first conductor is one method of increasing the surface area of the conductors because the later-deposited dielectric layer and second conductor will typically conform to the surface of the first deposited conductor.

Hemispherical grain silicon can be obtained by a number of methods including Low Pressure Chemical Vapor Deposition (LPCVD) at conditions resulting in a layer of roughened polysilicon. Another method includes depositing a layer of amorphous silicon, followed by high temperature seeding and/or annealing to cause the formation of hemispherical grain silicon.

The silicon layers to be converted into hemispherical grain silicon or deposited as hemispherical grain silicon are not, however, typically in situ doped during deposition because in situ doping of those layers can result in smaller grain size, thereby reducing surface area and capacitance. Furthermore, in processes where the HSG silicon layer is doped after formation, the roughness of the surface can be reduced by the post-formation doping processes. For example, diffusion doping of the HSG silicon may result in a layer of oxide that would need to be removed before deposition of the dielectric layer. The oxide layer may be removed using an etch process that could reduce the roughness of the HSG silicon layer. Ion implantation, another technique for doping an undoped layer of HSG silicon may also reduce the surface roughness of the HSG silicon.

SUMMARY OF THE INVENTION

The present invention provides methods of forming a roughened surface through diffusion-enhanced crystallization of an amorphous material. In one aspect, the present invention comprises conductive hemispherical grain silicon formed through dopant diffusion-enhanced crystallization of one or more layers of amorphous silicon.

To further enhance uniformity in the formation of the hemispherical grain silicon, the exposed surface of the amorphous silicon can be seeded before crystallization to further enhance uniformity of the surface structures formed in the hemispherical grain silicon.

In one aspect, the present invention provides a method of forming a roughened surface comprising steps of providing a layer having an exposed surface on a substrate, the layer comprising an amorphous material and at least a portion of the layer including a dopant, wherein the concentration of dopant is substantially lower at the exposed surface than in at least a portion of the underlying amorphous material; and crystallizing the amorphous material to form the roughened surface.

In another aspect, the present invention provides a method of forming hemispherical grain silicon comprising steps of providing a layer having an exposed surface on a substrate, the layer comprising amorphous silicon and at least a portion of the amorphous silicon including a dopant, wherein the concentration of dopant is substantially lower at the exposed surface than in at least a portion of the underlying amorphous silicon; and annealing the layer of amorphous silicon.

In another aspect, the present invention provides a method of increasing the uniformity in a layer of hemispherical grain silicon comprising steps of providing a layer comprising amorphous material having an exposed surface on a substrate, at least a portion of the amorphous silicon including a dopant, wherein the concentration of the dopant is substantially lower at the exposed surface than in at least a portion of the underlying amorphous silicon; providing seeds on the exposed surface; and annealing the layer of amorphous silicon after the seeds are provided on the exposed surface.

In another aspect, the present invention provides a method of forming hemispherical grain silicon comprising steps of providing a first layer of doped amorphous silicon on a substrate; providing a second layer of amorphous silicon having an exposed surface opposite the first layer, wherein the second layer of amorphous silicon is undoped or doped to a concentration less than the concentration of dopant in the first layer; annealing the first and second layers of silicon.

In another aspect, the present invention provides a method of increasing uniformity in a layer of hemispherical grain silicon comprising steps of providing a first layer of doped amorphous silicon on a substrate; providing a second layer of amorphous silicon having an exposed surface opposite the first layer, wherein the second layer of amorphous silicon is undoped or doped to a concentration less than the concentration of dopant in the first layer; providing seeds on the exposed surface of the second layer of amorphous silicon; and annealing the first and second layers of amorphous silicon after the seeds are provided on the exposed surface of the second layer.

In another aspect, the present invention provides a method of forming hemispherical grain silicon comprising steps of providing a base layer of amorphous silicon on a substrate; providing a first layer of doped amorphous silicon on the base layer; forming a second layer of amorphous silicon on the first layer the second layer having an exposed surface, wherein the second layer of amorphous silicon is undoped or doped to a concentration less than the concentration of dopant in the first layer; annealing the base, first, and second layers of silicon.

In another aspect, the present invention provides a method of improving uniformity in a layer of hemispherical grain silicon comprising steps of providing a base layer of amorphous silicon on a substrate; providing a first layer of doped amorphous silicon on the base layer; forming a second layer of amorphous silicon on the first layer, the second layer having an exposed surface, wherein the second layer of amorphous silicon is undoped or doped to a concentration less than the concentration of dopant in the first layer; providing seeds on the exposed surface of the second layer of amorphous silicon; and annealing the base, first, and second layers of amorphous silicon after the seeds are provided on the exposed surface of the second layer.

In another aspect, the present invention provides a method for manufacturing a semiconductor device comprising steps of providing a layer comprising amorphous material having an exposed surface on a semiconductor substrate, at least a portion of the amorphous silicon including a dopant, wherein the concentration of dopant is substantially lower at the exposed surface than in at least a portion of the underlying amorphous silicon; annealing the layer of amorphous silicon to form conductive hemispherical grain silicon, wherein the layer of conductive hemispherical grain silicon forms a first electrode of a capacitor; providing a layer of dielectric material on the first electrode; and providing a second electrode of the capacitor on the dielectric material.

In another aspect, the present invention provides a method for manufacturing a semiconductor device comprising steps of providing a layer comprising amorphous material having an exposed surface on a semiconductor substrate, at least a portion of the amorphous silicon including a dopant, wherein the concentration of dopant is substantially lower at the exposed surface than in at least a portion of the underlying amorphous silicon; providing seeds on the exposed surface of the amorphous silicon; annealing the layer of amorphous silicon to form conductive hemispherical grain silicon, wherein the layer of conductive hemispherical grain silicon forms a first electrode of a capacitor; providing a layer of dielectric material on the first electrode; and providing a second electrode of the capacitor on the dielectric material.

These and other features and advantages of methods according to the present invention are described in the detailed description of the invention below.

DETAILED DESCRIPTION OF THE INVENTION

Figure 1:
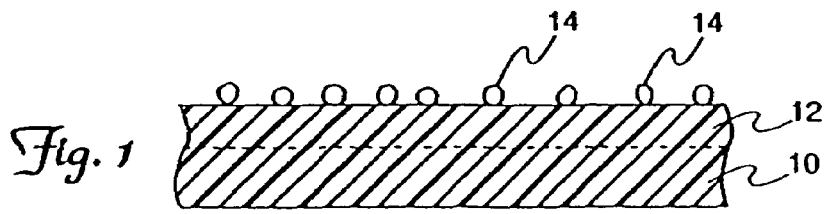
FIG. 1 is a cross-sectional schematic diagram of one combination of layers of silicon provided before annealing to produce HSG silicon in one method according to the present invention.

The present invention comprises methods of providing a roughened surface through diffusion-enhanced crystallization of an amorphous material. The diffusion used to enhance formation of the roughened surface during crystallization can be diffusion of a dopant used to enhance electrical conductivity, or the dopant may be provided merely to enhance surface roughness as a result of diffusion of the dopant through the amorphous material during crystallization.

One particular method in which a roughened surface can be formed through diffusion-enhanced crystallization of an amorphous material is in the crystallization of doped amorphous silicon material to form conductive hemispherical grain silicon. Although the discussion below focuses on silicon as both the amorphous material and the resulting conductive polysilicon layer, it will be understood that other amorphous crystallizable materials may be used in place of silicon.

Roughened surfaces formed according to the methods of the present invention are particularly useful in the manufacture of a DRAM. It should be understood, however, that the methods of providing roughened surfaces according to the present invention could be used in any application or structure in which a roughened surface would be useful.

Furthermore, the methods of the present invention are particularly well-suited for providing a roughened surface on a semiconductor substrate or substrate assembly, referred to herein generally as "substrate," used in forming integrated circuits, such as a silicon wafer, with or without layers or structures formed thereon. It is to be understood that the methods of the present invention are not limited to deposition on silicon wafers; rather, other types of wafers (e.g., gallium arsenide, etc.) can be used as well. Also, the methods of the present invention can be used in connection with silicon-on-insulator or silicon-on-sapphire technology. In addition, substrates other than semiconductor substrates or substrate assemblies can be used in connection with the present invention. These include, for example, fibers, wires, etc. If the substrate is a semiconductor substrate or substrate assembly, the roughened surface can be formed directly on the lowest semiconductor surface of the substrate, or it can be formed on any variety of other layers or structures formed on the substrate.

It will be understood that the methods of the present invention will typically be performed in chemical vapor deposition (CVD) chambers of the type used to process semiconductor wafers, although any equipment and methods for depositing layers of amorphous materials could be used to perform the methods according to the present invention. As used herein, the term "deposition temperature" will typically refer to the surface temperature of the substrate or layer on which a material is being deposited; the term "flow rate" as used in connection with gas flow rates will typically refer to the gas flow rate through the CVD chamber; and the term "chamber pressure" will typically refer to the pressure in the CVD chamber.

It will also be understood that as used in connection with the present invention, the term "annealing" includes exposing formed layers to any combination of temperature and pressure such that diffusion-enhanced crystallization of one or more layers of amorphous materials caused.

The present invention provides methods of enhancing or controlling the uniformity and grain height in a crystallized amorphous material, such as HSG silicon. That control is accomplished by using dopant diffusion within one or more layers of amorphous material, e.g., silicon, to enhance grain height in a resulting layer after crystallization. As described below, one or more layers of amorphous material, e.g., silicon, are deposited on a substrate. Where two or more layers of amorphous materials are used, it is preferred that one layer be doped while the other layer is undoped or only lightly doped and, further, that no native oxides be located between the layers. The change in dopant concentration between the doped layer and undoped or lightly doped layer results in a diffusion gradient between the layers. It is theorized that diffusion, i.e., movement, of the dopant atoms from the doped layer into the undoped or lightly doped layer during crystallization may enhance the grain height in the resulting crystallized material because the dopant atoms are generally moving or diffusing towards the exposed surface of the undoped or lightly doped layer.

The relative variations in dopant concentration between the doped layers and undoped or lightly doped layers can be controlled to potentially provide additional control over the grain height of the resulting crystallized material, e.g., hemispherical grain silicon. For example, a heavily doped amorphous layer and undoped amorphous layer may provide a more rugged surface than, for example, a heavily doped amorphous layer and lightly doped amorphous layer. The change in grain height can be attributed to the different diffusion gradients in the two examples. In other words, a higher diffusion gradient (caused by an increased variation in dopant concentration in the amorphous silicon) will typically result in a more rugged surface while a lower diffusion gradient will typically result in a layer with reduced grain height (provided all other process parameters are relatively unchanged).

Additional control over the grain height of the resulting crystallized material can be further enhanced by seeding the exposed surface of amorphous material before crystallization. The seeds provide crystallization sites and control over their density that can influence grain size and height in the resulting crystallized material. When combined with diffusion-enhanced crystallization, the methods according to the present invention further enhance achievable grain height and provide the opportunity for greater control and uniformity over the processes used to form roughened surfaces from crystallized materials such as HSG silicon.

Referring now to FIG. 1, a cross-section of one combination of layers of silicon used to form HSG silicon according to the present invention is depicted. The depicted combination includes a first layer 10 and a second layer 12 on the first layer 10. A layer of seeds 14 may be provided on the exposed surface of the second layer 12. The thickness of the first layer 10 is preferably about 300 Angstroms, while the thickness of the second layer 12 is preferably about 300 Angstroms, although both of those values can vary depending on the particular application. Typically, however, the second layer 12 should be thin enough to maintain high conductance in the finished layer of hemispherical grain silicon.

Layer 10 is preferably formed of doped amorphous silicon. The doped amorphous silicon of first layer 10 is preferably deposited by chemical vapor deposition using a source gas such as silane, disilane, silicochloroform, etc. The source gas may be diluted with an inert gas or gases according to any suitable practice. Also, the source gas may comprise a combination of two or more different source gases as well as one or more inert carrier gases. When layer 10 is deposited by chemical vapor deposition, it is preferred that the deposition temperature is held at about 550° C. or less to ensure the formation of substantially amorphous silicon in the first layer 10.

The first layer 10 is preferably in-situ doped, i.e., doped during formation, with a desired conductive dopant (not shown) such as phosphorous, although any suitable dopant could be used in layer 10. The concentration of dopant in layer 10 can vary up to the saturation point, although it is preferably about 1E19 to about 1E21 atoms/cm$^3$. Although the concentration of dopant in the first layer 10 will typically be homogeneous throughout the layer, it may be desirable to vary the concentration throughout the thickness of the first layer 10. In particular, it may be helpful to begin with a relatively low concentration of dopant near the substrate and increase the concentration in the later deposited portions of the first layer 10.

The second layer 12 preferably comprises undoped or lightly doped amorphous silicon. By undoped, it is meant that, as formed, the second layer 12 is substantially free of any conductive impurities. Because the second layer 12 is undoped or lightly doped amorphous silicon, the dopant from the first layer 10 will typically diffuse into the second layer 12 during the annealing step in the process, thereby enhancing grain height in the resulting HSG silicon as described above.

Figure 2A:
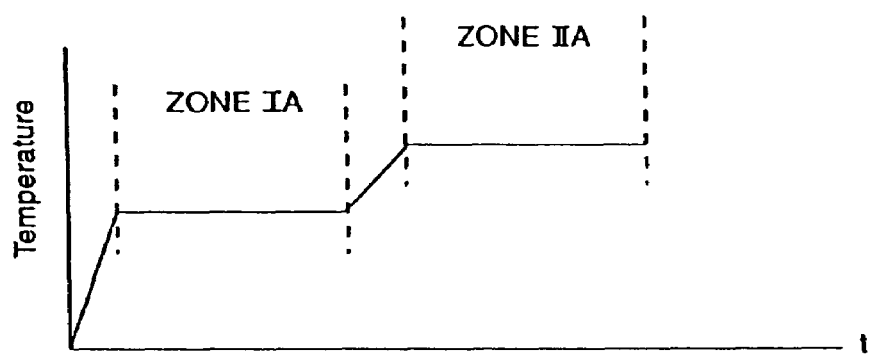
FIGS. 2A–2C are graphical representations of one combination of deposition temperatures, gas flow rates, and chamber pressures used to produce the layers depicted in FIG. 1.
Figure 2B:
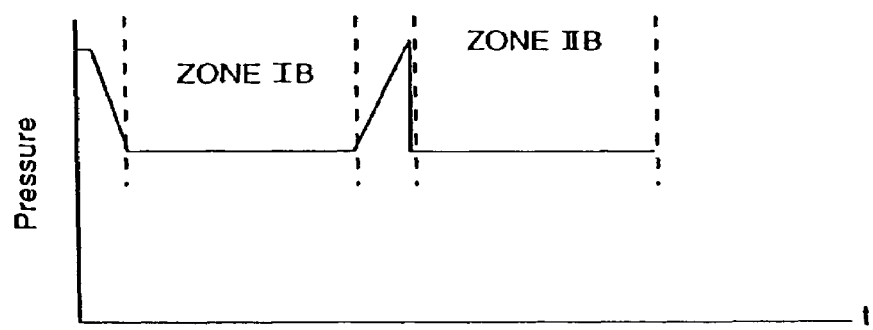
Figure 2C:
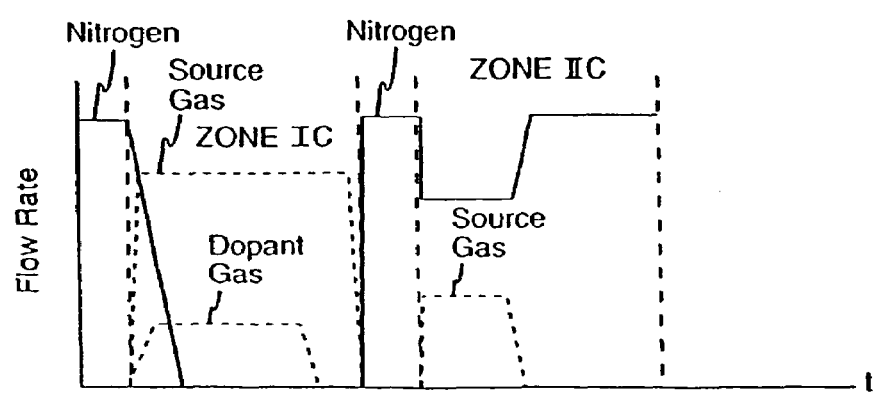

The second layer 12 is preferably formed directly on the first layer 10, i.e., there is no additional layer of any other material, such as silicon oxide, between the first layer 10 and second layer 12. The first layer 10 and second layer 12 may be formed using methods that prevent the formation of, for example, native oxides, between layers 10 and 12. One example of such a process is depicted in FIGS. 2A–2C. It will, however, be understood that it may be necessary to clean the first layer 10 to remove any impurities or intervening layers of material before forming the second layer 12 to ensure that the second layer 12 is deposited on the first layer 10 in accordance with the methods of the present invention. The removal of impurities between the first layer 10 and second layer 12 can be performed by any suitable method for removing the undesired impurity.

The seeds 14, also referred to herein as the seed layer 14, formed on the second layer 12 are provided to initiate crystallization during annealing to produce HSG silicon. The seed layer 14 is preferably formed of a material that is chemically similar to silicon to enhance formation of HSG silicon. Examples of suitable materials include hydrides, germane, phosphine, etc.

In one preferred method, the seed layer 14 is formed of silicon using chemical vapor deposition techniques. When chemical vapor deposition is used to form seed layer 14 on the second layer 12, the deposition temperature during formation of the seeds 14 is preferably maintained between about 550° C. and about 600° C. to promote the nucleation of crystalline silicon on the surface of the second layer 12.

The density of the seeds 14 on the second layer 12 of amorphous silicon also determines (in addition to the dopant concentration gradients discussed above), to some degree, the grain height of the resulting HSG silicon after annealing. The optimal density is a balance between too few seeds 14 (in which case the formation of HSG silicon is impaired because too few crystallization sites are provided on second layer 12) and too many seeds 14 (in which case the size of the HSG grains is limited because too many crystallization sites were provided on the surface of the second layer 12). It is preferred that the density of the seeds 14 on layer 12 be about 500/$\mu m^2$ or less, more preferably about 300/$\mu m^2$. In another aspect, the density of the seeds is preferably between about 200/$\mu m^2$ to about 300/$\mu m^2$. These values are, however, somewhat dependent on the thickness of the first and second layers 10 and 12, the concentrations of any dopants in the first and second layers 10 and 12, and other factors as well.

Turning now to FIGS. 2A–2C, a chemical vapor deposition process that can be used to form the structure depicted in FIG. 1 will be described in terms of deposition temperatures, gas flow rates, and chamber pressures. FIG. 2A depicts the deposition temperature (vertical axis) as a function of time (horizontal axis). Deposition of both the first layer 10 of doped amorphous silicon as well as the second layer 12 of undoped amorphous silicon preferably take place during Zone IA at deposition temperatures of about 550° C. or less. That deposition temperature, i.e., 550° C., is generally considered to be the transition point between the formation of substantially all amorphous silicon (which typically takes place below 550° C.) and the formation of polycrystalline or crystalline silicon. Although the deposition temperature in Zone IA is depicted as constant, it will be understood that the deposition temperature may vary as desired, provided that the first and second layers of silicon 10 and 12 are substantially all amorphous silicon.

Zone IIA depicted in FIG. 2A illustrates the deposition temperature during the formation of seeds 14 on the second layer 12, as well as the subsequent annealing to produce HSG silicon. It is preferred that the deposition temperature during formation of the seeds 14 is maintained between about 550° C. and about 600° C. to enhance the formation of HSG silicon, although higher temperatures are possible.

Although the deposition temperature in Zone IIA is depicted as generally constant during formation of the seed layer 14 and subsequent annealing step, it will be understood that the temperatures may vary. For example, it may be desirable to deposit the seeds 14 at a higher or lower temperature, and to then change the chamber or deposition temperature after the seed layer 14 has been deposited.

FIG. 2B is a graphical representation of chamber pressure (vertical axis) as a function of time (horizontal axis) during the CVD process described with respect to the combination of FIGS. 2A–2C. As depicted, chamber pressure is preferably held substantially constant during Zone IB which corresponds to Zone IA in FIG. 2A. As shown, the chamber pressure is held substantially constant during formation of both layers 10 and 12.

One preferred chamber pressure during Zone IB is about 200×10$^{-3}$ Torr, although the chamber pressure during deposition of the first layer 10 of doped amorphous silicon and second layer 12 of undoped amorphous silicon can range from about 50×10$^{-3}$ to about 2000×10$^{-3}$ Torr. Also, it will be understood that although the chamber pressure is depicted as remaining substantially constant in Zone IB, it may be varied as desired, provided the amorphous silicon layers are formed.

FIG. 2B also illustrates that the chamber pressure during Zone IIB is typically held at about the same level as during Zone IB. Zone IIB encompasses the process steps of forming the seed layer 14 on the second layer 12 and the subsequent annealing to form HSG silicon. Like the chamber pressures in Zone IB, chamber pressures in Zone IIB can range from about 50×10$^{-3}$ to about 2000×10$^{-3}$ Torr, with one preferred chamber pressure being about 200 mTorr. Also, it will be understood that although the chamber pressure is depicted as remaining substantially constant in Zone IIB, it may be varied as desired, provided the desired seed layer 14 and annealing to form HSG silicon are performed as desired in the chamber pressures provided.

Turning now to FIG. 2C, the gas flow rates used to deposit the first layer 10 of doped amorphous silicon, second layer 12 of undoped amorphous silicon, and seed layer 14 of crystalline silicon in one method according to the present invention using chemical vapor deposition are depicted. It will be understood that the flow rates shown are relative only and, furthermore, that the flow rates are dependent on the size of the CVD chamber, desired deposition rates, deposition temperatures, chamber pressures, and other factors.

The process depicted in FIG. 2C begins with a flow of nitrogen through the chamber to establish equilibrium. At the beginning of Zone IC depicted in FIG. 2C, a source gas, for example, silane, is introduced to begin the formation of the first layer 10 of amorphous silicon. The dopant gas, for example PH$_3$, is introduced into the CVD chamber at the same time as the source gas to conductively dope the first layer 10. Relative flow rates of the source gas and dopant gas can be adjusted to provide the desired concentration of dopant in the first layer 10.

In the particular method depicted in FIGS. 2A–2C, the source gas includes silane diluted with an inert gas (for example, argon, helium, etc.) while the dopant gas comprises PH$_3$. The flow rate of the source gas is preferably about 200 standard cubic centimeters per minute (sccm) and the flow rate of the dopant gas is preferably about 0.2 sccm.

As shown, the flow of dopant gas into the chamber is discontinued before the end of Zone IC while the flow of source gas continues. It is during the portion of Zone IC in which only the source gas is provided that the second layer 12 of undoped amorphous silicon is formed on the first layer 10 of doped amorphous silicon.

After the desired amount of undoped amorphous silicon for second layer 12 has been formed on the first layer, the flow of source gas is discontinued and the flow of nitrogen or another suitable gas is provided until the start of Zone IIC in which the flow of source gas, for example, silane, is restarted to begin the formation of the seed layer 14 on the second layer 12. As shown, it may be desirable to reduce the flow rate of the nitrogen while the source gas is provided. After the desired density of seeds 14 have been formed, the source gas is discontinued and the flow of nitrogen is continued during the anneal portion of Zone IIC.

Figure 3:
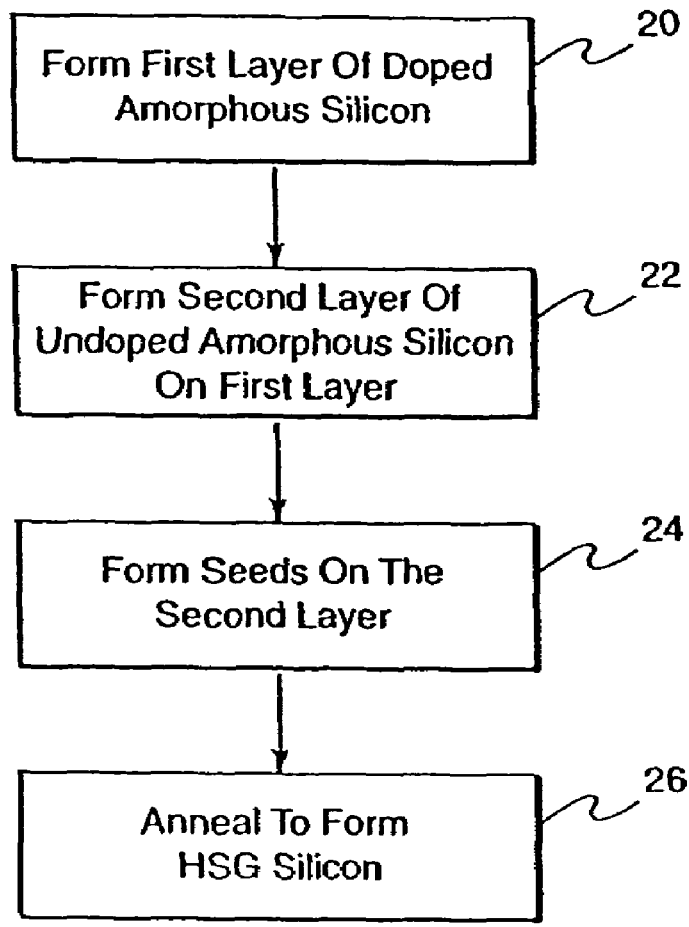
FIG. 3 is a flow diagram of the method used to provide the structure of FIG. 1.

One method of forming HSG silicon according to the present invention is depicted in the flow diagram of FIG. 3. The depicted method includes the step 20 of forming a first layer of doped amorphous silicon, step 22 of forming a second layer of undoped amorphous silicon on the first layer of doped amorphous silicon, step 24 of seeding the second layer of undoped amorphous silicon, and step 26 of annealing the formed layers to form HSG silicon.

Figure 4:
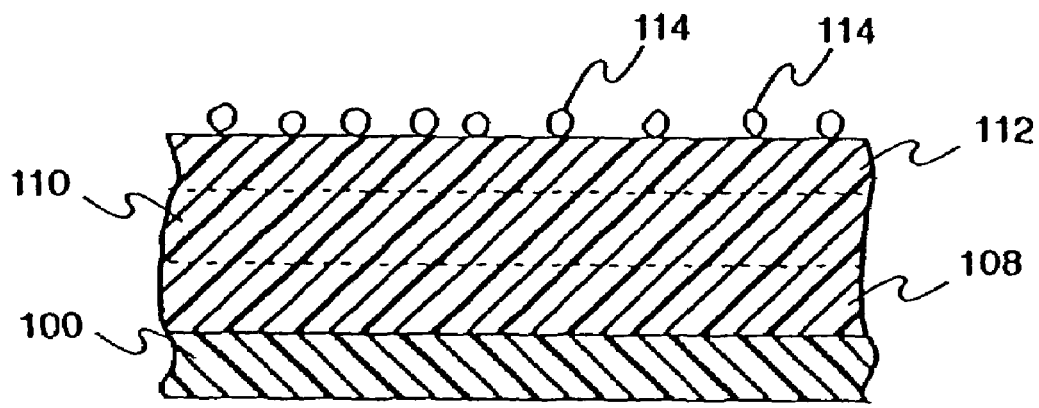
FIG. 4 is a cross-sectional schematic diagram of another combination of layers of silicon provided before annealing to produce HSG silicon in one method according to the present invention.

Referring now to FIG. 4, a cross-section of an alternative combination of layers of amorphous silicon used to form HSG silicon according to the present invention is depicted. The depicted combination includes a base layer 108 on a substrate 100, a first layer 110 on the base layer 108, and a second layer 112 on the first layer 110. A layer of seeds 114 is provided on the exposed surface of the second layer 112. The thickness of the base layer 108 is preferably about 100 Angstroms, the thickness of the first layer 110 is preferably about 200 Angstroms, and the thickness of the second layer 112 is preferably about 300 Angstroms, although those values can vary depending on the particular application. Typically, however, the second layer 112 should be thin enough to ensure that the resulting layer of hemispherical grain silicon is electrically conductive.

The base layer 108 is preferably formed of undoped or lightly doped amorphous silicon. One advantage of providing an undoped or lightly doped base layer 108 on substrate 100 is that the quality of the interface between the substrate 100 and the base layer 108 of undoped or lightly doped amorphous silicon may be improved as compared to the interface between the substrate 100 and a layer of a more heavily doped amorphous silicon (particularly when the substrate 100 includes an insulator layer such as an oxide or nitride on its exposed surface).

Typically, the base layer 108 will be deposited by chemical vapor deposition techniques using a source gas such as silane, disilane, silicochloroform, etc., although any suitable method could be employed. The source gas may be diluted with an inert gas or gases according to any suitable practice. Also, the source gas may comprise a combination of two or more different source gases as well as one or more inert carrier gases. When base layer 108 is deposited by chemical vapor deposition, it is preferred that the deposition temperature is held at about 550° C. or less to ensure the formation of substantially amorphous silicon in the first layer 108.

First layer 110 is preferably formed of doped amorphous silicon. The doped amorphous silicon of first layer 110 is also preferably deposited by chemical vapor deposition in techniques similar to those described for base layer 108 above.

One difference, however, is that the first layer 110 is preferably in-situ doped, i.e., doped during formation, with a desired conductive dopant (not shown) such as phosphorous, although any suitable dopant could be used in layer 110. The concentration of dopant in layer 110 can vary up to the saturation point, although it is preferably about 1E20 to about 5E21 atoms/cm$^3$. Also, although the concentration of dopant will be generally homogeneous in first layer 110, it may be varied throughout the thickness of the first layer 110 if desired. It may be possible to provide increased concentrations of dopant in the first layer 110 as opposed to the first layer 10 above because the quality of the interface between a heavily doped first layer 110 and substrate 100 is not an issue because of the inclusion of the undoped or lightly doped base layer 108 to improve adhesion.

The second layer 112 preferably comprises an undoped or lightly doped amorphous silicon. Because the base layer 108 and second layer 112 are formed of undoped or lightly doped amorphous silicon, the dopant from the first layer 110 will typically diffuse into the base layer 108 as well as the second layer 112 during the annealing step in the process to provide a conductive HSG silicon layer.

Figure 5A:
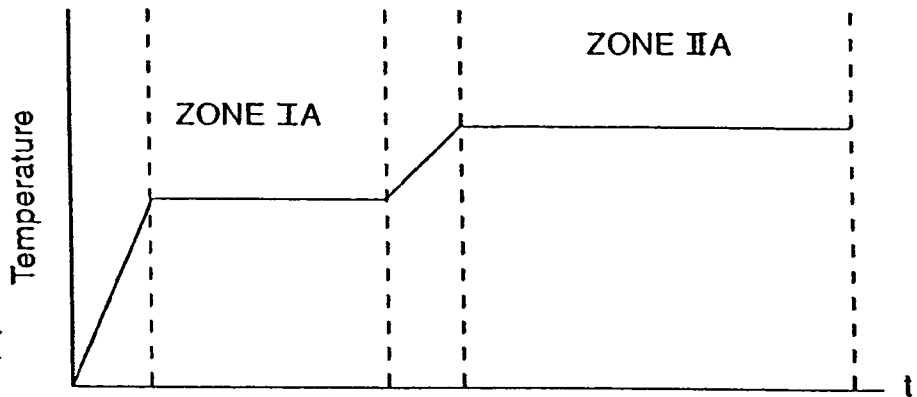
FIGS. 5A–5C are graphical representations of one combination of deposition temperatures, gas flow rates, and chamber pressures used to produce the layers depicted in FIG. 4.
Figure 5B:
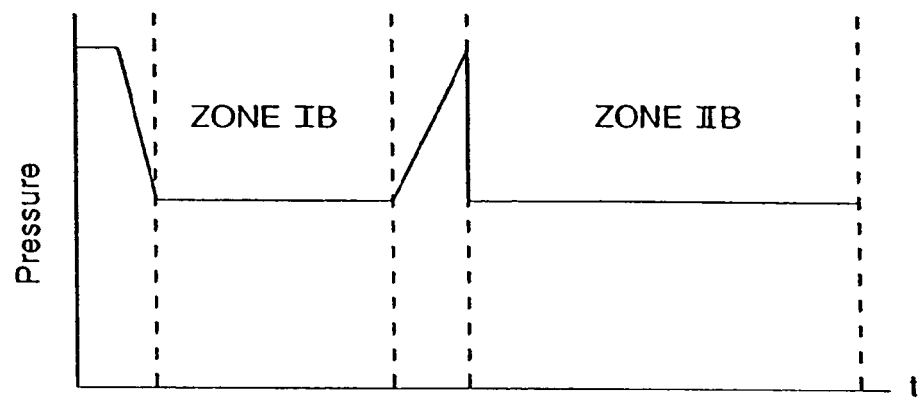
Figure 5C:
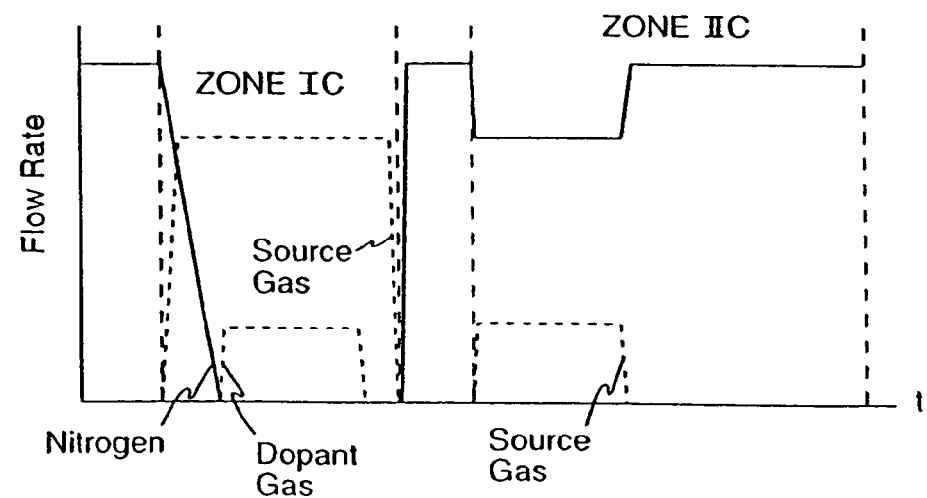

It is preferred that the interface between each pair of adjacent layers, i.e., between the base layer 108 and the first layer 110, as well as between the first layer 110 and the second layer 112, be free of any impurities such as native oxides, etc. Preferably, each successive layer will be formed directly on the preceding layer such that there is no additional layer of any other material, such as silicon oxide, between the adjacent layers. The layers may be formed using methods that prevent the formation of, for example, native oxides, between adjacent layers. One example of such a process is depicted in FIGS. 5A–5C. It will, however, be understood that it may be necessary to clean the preceding layer to remove any impurities or intervening layers of material before forming the successive layer to ensure that the successive layer is deposited on the preceding layer in accordance with the methods of the present invention. The removal of impurities between the successive layers can be performed by any suitable method for removing the undesired impurity.

The seeds 114, also referred to herein as the seed layer 114, formed on the second layer 112 are provided to initiate crystallization during annealing to produce HSG silicon. For more detailed information about seed layer 1114, reference can be had to the description of seed layer 14 depicted in FIG. 1 above.

Turning now to FIGS. 5A–5C, a chemical vapor deposition process that can be used to form the structure depicted in FIG. 4 will be described in terms of deposition temperatures, gas flow rates, and chamber pressures. FIG. 5A depicts the deposition temperature (vertical axis) as a function of time (horizontal axis). Deposition of the base layer 108 of undoped amorphous silicon, first layer 110 of doped amorphous silicon, and the second layer 112 of undoped amorphous silicon preferably take place during Zone IA in FIG. 5A at deposition temperatures of about 550° C. or less. That deposition temperature, i.e., 550° C., is generally considered to be the transition point between the formation of substantially all amorphous silicon (which typically takes place below 550° C.) and the formation of polycrystalline or crystalline silicon. Although the deposition temperature in Zone IA is depicted as constant, it will be understood that the deposition temperature may vary as desired, provided that the layers of silicon 108, 110, and 112 are substantially all amorphous silicon.

Zone IIA depicted in FIG. 5A illustrates the deposition temperature during the formation of seeds 114 on the second layer 112, as well as the subsequent annealing to produce HSG silicon. It is preferred that the deposition temperature during formation of the seeds 114 is maintained between about 550° C. and about 600° C. to enhance the formation of HSG silicon, although higher temperatures are possible.

Although the deposition temperature in Zone IIA is depicted as generally constant during formation of the seed layer 114 and subsequent annealing step, it will be understood that the temperatures may vary. For example, it may be desirable to deposit the seeds 114 at a higher or lower temperature, and to then change the chamber or deposition temperature after the seed layer 114 has been deposited.

FIG. 5B is a graphical representation of chamber pressure (vertical axis) as a function of time (horizontal axis) during the CVD process described with respect to the combination of FIGS. 5A–5C. As depicted, chamber pressure is preferably held substantially constant during Zone IB in FIG. 5B which corresponds to Zone IA in FIG. 5A. As shown, the chamber pressure is preferably held substantially constant during formation of layers 108, 110, and 112.

One preferred chamber pressure during Zone IB is about $200 \times 10^{-3}$ Torr, although the chamber pressure during deposition of the base layer 108 of undoped amorphous silicon, first layer 110 of doped amorphous silicon, and second layer 112 of undoped amorphous silicon can range from about 50×10$^{-3}$ to about 2000×10$^{-3}$ Torr. Also, it will be understood that although the chamber pressure is depicted as remaining substantially constant in Zone IB, it may be varied as desired, provided the amorphous silicon layers are formed.

FIG. 5B also illustrates that the chamber pressure during Zone IIB is typically held at about the same level as during Zone IB. Zone IIB encompasses the process steps of forming the seed layer 114 on the second layer 112 and the subsequent annealing to form HSG silicon. Like the chamber pressures in Zone IB, chamber pressures in Zone IIB can range from about 50×10$^{-3}$ to about 2000×10$^{-3}$ Torr, with one preferred chamber pressure being about 200 mTorr. Also, it will be understood that although the chamber pressure is depicted as remaining substantially constant in Zone IIB, it may be varied as desired, provided the desired seed layer 114 and annealing to form HSG silicon are performed as desired in the chamber pressures provided.

Turning now to FIG. 5C, the gas flow rates used to deposit the base layer 108 of undoped amorphous silicon, first layer 110 of doped amorphous silicon, second layer 112 of undoped amorphous silicon, and seed layer 114 of crystalline silicon in one method according to the present invention using chemical vapor deposition are depicted. It will be understood that the flow rates shown are relative only and, furthermore, that the flow rates are dependent on the size of the CVD chamber, desired deposition rates, deposition temperatures, chamber pressures, and other factors.

The process depicted in FIG. 5C begins with a flow of nitrogen through the chamber to establish equilibrium. At the beginning of Zone IC depicted in FIG. 5C, a source gas, for example, silane, is introduced into the CVD chamber to begin the formation of the base layer 108 of undoped amorphous silicon. After the desired amount of undoped amorphous silicon is formed, the first layer 110 of doped amorphous silicon is formed by introducing a dopant gas, for example PH$_3$, into the CVD chamber along with the source gas to conductively dope the first layer 110. Relative flow rates of the source gas and dopant gas can be adjusted to provide the desired concentration of dopant in the first layer 110. In the particular method depicted in FIGS. 5A–5C, the source gas includes silane diluted with an inert gas (for example, argon, helium, etc.) while the dopant gas comprises PH$_3$. The flow rate of the source gas is preferably about 200 standard cubic centimeters per minute (sccm) during formation of both the base layer 108 and the first layer 110. The flow rate of the dopant gas during formation of the first layer 110 is preferably about 0.2 sccm.

As shown, the flow of dopant gas into the CVD chamber is discontinued before the end of Zone IC while the flow of source gas continues. It is during the portion of Zone IC in which only the source gas is provided that the second layer 112 of undoped amorphous silicon is formed on the first layer 110 of doped amorphous silicon.

After the desired amount of undoped amorphous silicon for second layer 112 has been formed on the first layer 110, the flow of source gas is discontinued and a flow of nitrogen or another suitable gas is provided until the start of Zone IIC in which the flow of source gas, for example, silane, is restarted to begin the formation of the seed layer 114 on the second layer 112. As shown, it may be desirable to reduce the flow rate of the nitrogen while the source gas is provided. After the desired density of seeds 114 have been formed, the source gas is discontinued and the flow of nitrogen is continued during the anneal portion of Zone IC.

Figure 6:
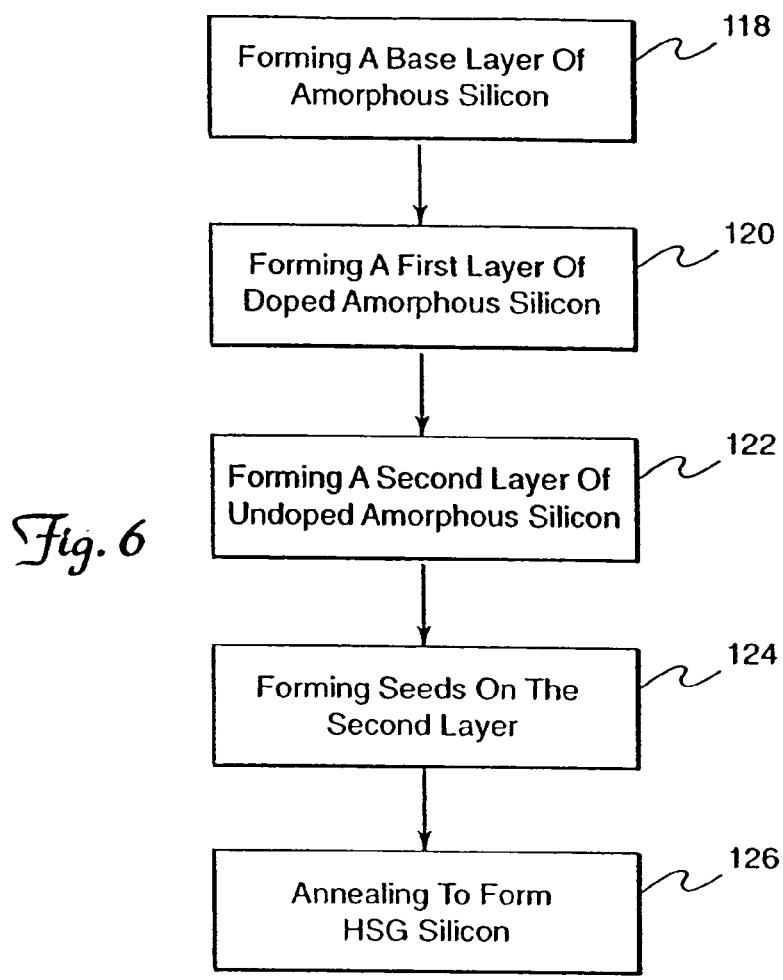
FIG. 6 is a flow diagram of the method used to provide the structure of FIG. 4.

The alternative method of forming HSG silicon as depicted in FIGS. 4 and 5A–5C are also depicted in the flow diagram of FIG. 6. As shown, the depicted method includes the step 118 of forming a base layer of undoped amorphous silicon, step 120 of forming a first layer of doped amorphous silicon on the base layer, step 122 of forming a second layer of undoped amorphous silicon on the first layer of doped amorphous silicon, step 124 of seeding the second layer of undoped amorphous silicon, and step 126 of annealing the formed layers to form HSG silicon.

Figure 7:
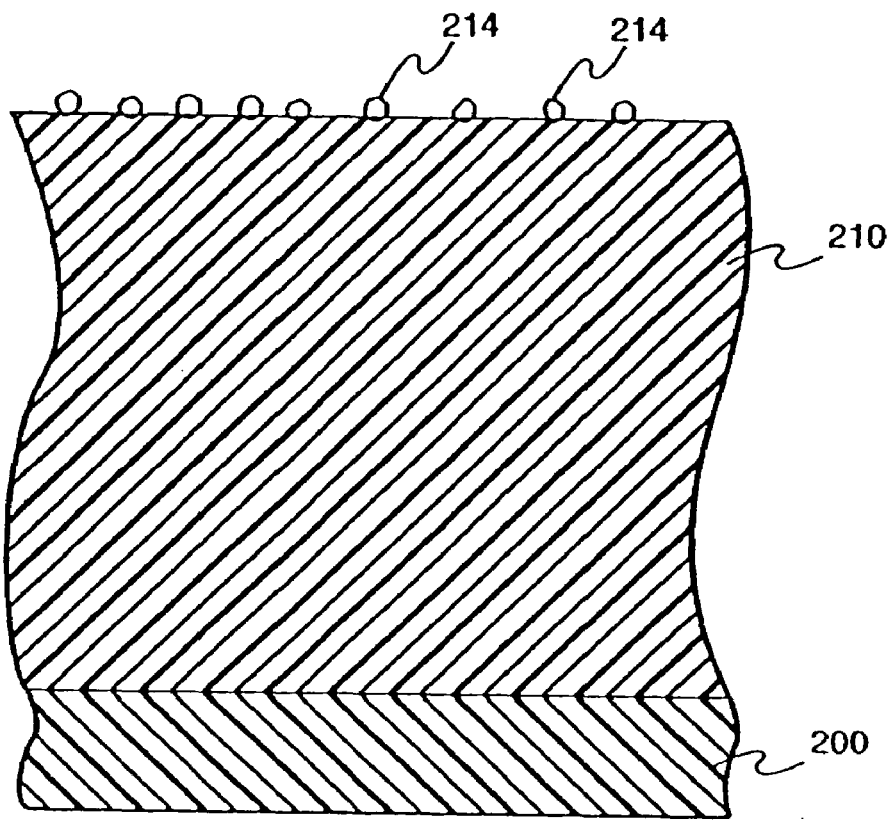
FIG. 7 is a cross-sectional schematic diagram of a layer of amorphous silicon on a substrate before annealing to produce HSG silicon in another method according to the present invention.
Figure 8:
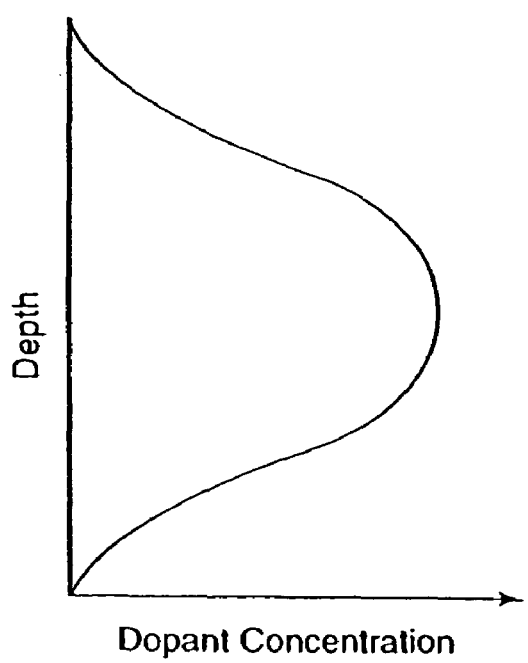
FIG. 8 is a graph of dopant concentration in the amorphous silicon layer of FIG. 7, with dopant concentration on the horizontal axis and vertical location within the layer on the vertical axis.

Although FIGS. 1 and 4 depict the various layers of amorphous silicon as being separately deposited to achieve the desired dopant concentration gradients to enhance grain height during crystallization to form HSG silicon, it will be understood that the dopant concentration in a single layer of amorphous silicon 210 on a substrate 200 can be varied as shown in FIGS. 7 and 8. FIG. 7 is a cross-sectional view of the layer 210 of amorphous silicon deposited according to any suitable method. FIG. 8 depicts the corresponding dopant concentration within layer 210 in relative terms. As shown, layer 210 can be undoped or only lightly doped near the bottom and more heavily doped in the center, followed by a lightly doped or undoped portion near the surface on which seeds 214 may be provided (as described above). It is the variation in dopant concentration throughout the height of the layer 210 that provides the diffusion-enhanced crystallization advantages of the present invention. As discussed above, it is desirable to reduce the dopant concentration near the exposed surface of the layer 210 to achieve enhanced grain height. Also, control over grain height may also be enhanced by controlling the rate of dopant concentration change within layer 210, i.e., a steeper rate of change in dopant concentration may increase grain height as opposed to a more gradual rate of change in the dopant concentration.

Figure 9:
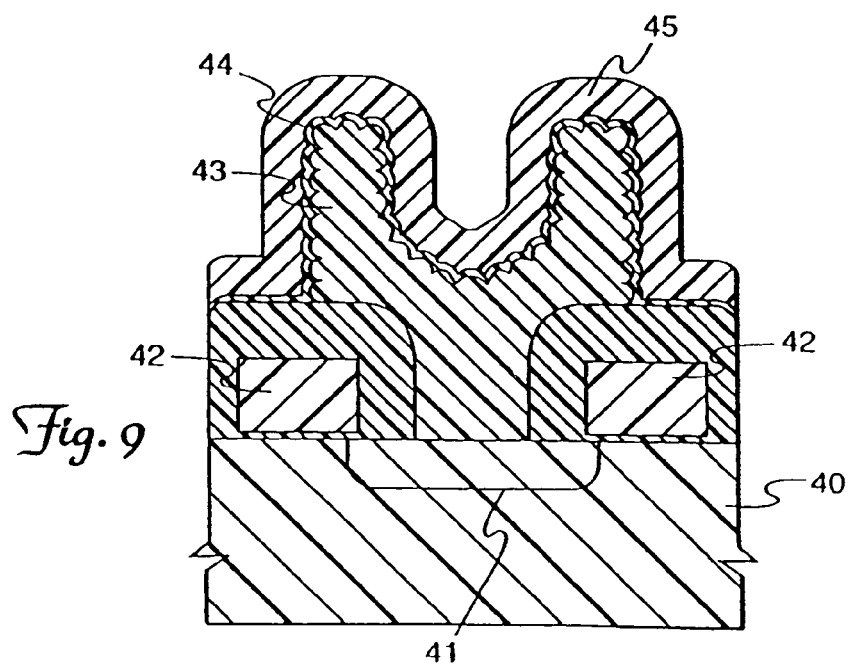
FIG. 9 is a cross-sectional schematic diagram of one structure including a layer of HSG silicon formed using methods according to the present invention.

The methods of the present invention can be used to form HSG on any desired structure, but one method will be more specifically described as used in the construction of a capacitor electrode incorporating HSG silicon. Turning to FIG. 9, a substrate 40 including a diffusion region 41 is provided. Access gates 42 are located above the diffusion region 41 and the distance between the access gates 42 is spanned by the diffusion region 41. The capacitor electrode structure 43 connects to the diffusion region 41 between access gates 42. It is the surface of the upper portion of the capacitor electrode structure 43 that includes the desired HSG silicon surface.

To provide the desired HSG silicon surface on capacitor electrode structure 43, a first layer of doped amorphous silicon can be formed on the structure 43 followed by formation of a second layer of undoped amorphous layer on the first layer of doped amorphous silicon. After both layers are deposited, the seeds can be formed on the second layer of undoped amorphous silicon, followed by annealing of the entire structure to transform the first and second layers of amorphous silicon into HSG silicon.

After the HSG silicon is formed on structure 43, a layer 44 of dielectric is deposited thereon, followed by formation of a second capacitor electrode 45 on the dielectric 44 to complete the capacitor.

Although two methods according to the present invention have been described, one employing two layers of amorphous silicon and the other employing three layers of amorphous silicon, it will be understood that the present invention could be extended to methods in which four or more layers of doped and undoped amorphous silicon are deposited, followed by seeding of the uppermost layer and annealing of the amorphous silicon layers to form the desired HSG silicon.

Although specific methods according to the present invention have been illustrated and described herein, it will be appreciated by those of ordinary skill in the art that any arrangement that is calculated to achieve the same purpose may be substituted for the specific methods and examples described. This application is intended to cover any adaptations or variations of the present invention. Therefore, it is manifestly intended that this invention be limited only by the claims and the equivalents thereof.

What is claimed is:

1. A method of forming hemispherical grain silicon comprising:
    forming a discrete layer comprising amorphous silicon on a substrate, the discrete layer having a thickness, wherein at least a portion of the amorphous silicon includes a dopant, and wherein a concentration of the dopant is at a maximum near a middle of the thickness of the discrete layer;
    forming a seed layer on an exposed surface of the discrete layer; and
    annealing the discrete layer.

2. The method of claim 1, wherein the concentration of the dopant is substantially lower at an exposed surface of the discrete layer than in at least an underlying portion of the discrete layer.

3. The method of claim 2, wherein the amorphous silicon at the exposed surface is substantially free of the dopant before annealing.

4. The method of claim 1, wherein forming the discrete layer comprising amorphous silicon comprises in situ doping of the amorphous silicon.

5. A method of forming hemispherical grain silicon comprising:
    providing a discrete layer comprising amorphous silicon on a substrate, at least a portion of the amorphous silicon including a dopant, wherein a concentration of the dopant varies through a depth of the discrete layer;
    forming a seed layer on an exposed surface of the discrete layer; and
    annealing the discrete layer and the seed layer to form the hemispherical grain silicon.

6. The method of claim 5, wherein the concentration of the dopant is at a maximum near a middle of the depth of the discrete layer before annealing.

7. The method of claim 5, wherein the amorphous silicon at the exposed surface is substantially free of the dopant before annealing.

8. The method of claim 5, wherein forming the seed layer comprises depositing a seed material chemically similar to silicon on the exposed surface.

9. The method of claim 8, wherein the seed material is selected from the group consisting of hydrides, germane, and phosphine.

10. The method of claim 5, wherein providing the discrete layer comprises forming the discrete layer by chemical vapor deposition using a silicon source gas and a dopant gas.

11. A method of forming hemispherical grain silicon comprising;
    forming a base layer comprising amorphous silicon on a substrate;
    forming a first layer comprising doped amorphous silicon on the base layer;
    forming a second layer comprising amorphous silicon directly on the first layer, the second layer having an exposed surface, wherein the second layer is undoped or doped to a concentration less than a concentration of dopant in the first layer;
    depositing a seed layer material on the exposed surface; and
    annealing the base, first, and second layers.

12. A method of forming hemispherical grain silicon comprising:
    forming a base layer comprising amorphous silicon on a substrate;
    forming a first layer comprising doped amorphous silicon on the base layer;
    removing impurities or intervening layers from the first layer;
    forming a second layer comprising amorphous silicon directly on the first layer, the second layer having an exposed surface, wherein the second layer is undoped or doped to a concentration less than a concentration of dopant in the first layer; and
    annealing the base, first, and second layers.

13. A method of forming hemispherical grain silicon comprising:
    forming a layer comprising amorphous silicon on a substrate, at least a portion of the amorphous silicon including a dopant, wherein a concentration of the dopant is substantially lower at an exposed surface of the layer than in at least an underlying portion of the layer;
    depositing a seed layer material on the exposed surface of the layer; and
    annealing the layer.

* * * * *